United States Patent [19]

Pleskac

[11] 4,116,518

[45] Sep. 26, 1978

[54] CLIP FOR PARALLELING PACKAGED INTEGRATED CIRCUIT CHIPS

[75] Inventor: Larry J. Pleskac, Escondido, Calif.

[73] Assignee: NCR Corporation, Dayton, Ohio

[21] Appl. No.: 829,305

[22] Filed: Aug. 31, 1977
(Under 37 CFR 1.47)

[51] Int. Cl.$^2$ .............................................. H05K 1/12
[52] U.S. Cl. ........................... 339/17 CF; 339/17 M; 339/255 P
[58] Field of Search .......... 339/17 CF, 17 M, 17 LM, 339/19, 75 M, 75 MP, 174, 176 MP, 200 P, 255 P, 261; 324/72.5, 158 F, 158 P

[56] References Cited

U.S. PATENT DOCUMENTS

| 3,045,336 | 7/1962 | Northrop et al. | 29/764 |
| 3,506,949 | 4/1970 | Venaleck et al. | 339/255 P |
| 3,912,984 | 10/1975 | Lockhart, Jr. et al. | 339/17 CF |

FOREIGN PATENT DOCUMENTS 1,246,101  9/1971  United Kingdom ................ 324/158 F

*Primary Examiner*—Neil Abrams
*Attorney, Agent, or Firm*—J. T. Cavender; Edward Dugas

[57] ABSTRACT

A clip having two body elements, each containing a plurality of parallel electrical contacts for simultaneously engaging like contact pins of stacked integrated circuit chips in order to electrically connect the contact pins in parallel. At least one of the electrical contacts being deletable from the body element in order to maintain at least one of the contact pins of each of the integrated circuit chips electrically isolated from the others.

10 Claims, 4 Drawing Figures

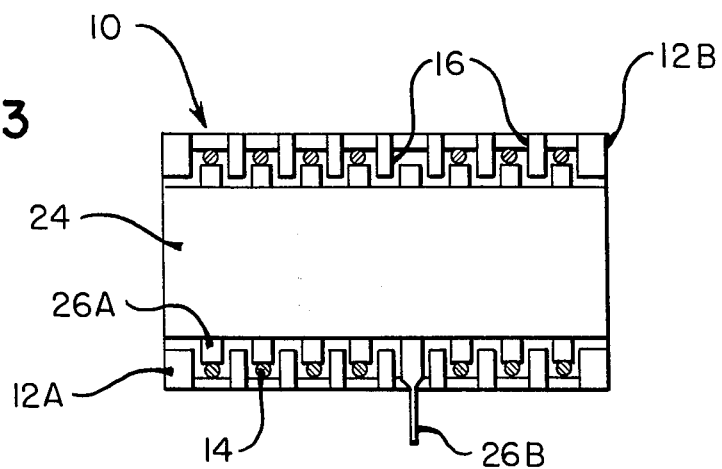
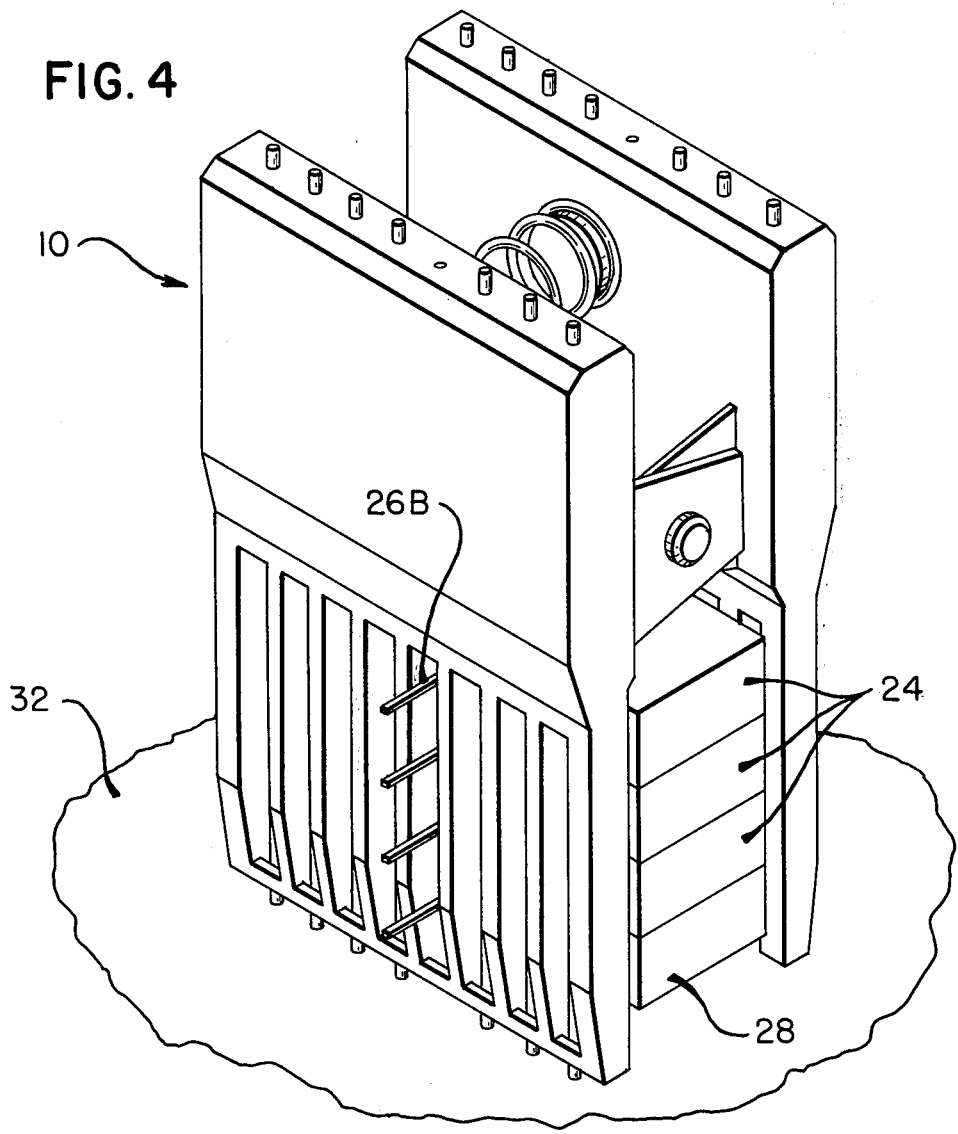

CLIP FOR PARALLELING PACKAGED INTEGRATED CIRCUIT CHIPS

BACKGROUND OF THE INVENTION

The present invention is directed to a clip for electrically connecting a plurality of integrated circuit chips in parallel with a similar integrated circuit chip that is connected in circuit on a circuit board. More particularly the present invention is directed to a clip for stacking dual-in-line integrated circuit packages and for electrically connecting the same in parallel so as to increase the density of the circuit board mounted integrated circuits without the necessity of extensive redesign.

In designing a microprocessor of the type which utilizes integrated circuit chips, the designer allocates a fixed amount of board space to a fixed number of memory chips, which number depends on the strength of the desired processor. Typically, a small microprocessor would utilize a single memory chip having 1K worth of memory. Once the design is finalized and the system is in operation, expansion of the memory, to a capability past the design capability, requires expensive modifications in the circuit boards on which the memory chips are located.

The clip of the present invention enables the paralleling of like memory chips with a memory chip that is mounted to a circuit board. Expansion of memory is generally accomplished by paralleling all common lines except, for example, the chip enable (memory enable line), such that only the chip receiving an enable signal will be selected and respond to the signals appearing on the remaining chip pins, for example, the input and output pins, the address pins, and the data in and the data out pins. It would be highly advantageous to eliminate the redesign of a board in order to accommodate additional memory chips and, in addition, it would be advantageous to have the capability of adding additional memory chips in a manner which enables easy rework of the chips.

SUMMARY OF THE INVENTION

The present invention is directed to a clip for electrically connecting one or more stacked, integrated circuit chips in parallel with a board mounted integrated circuit chip. The clip is comprised of two body elements, each having a plurality of parallel, electrical contacts affixed thereto, and spaced to correspond to the position of associated integrated circuit chip pins. The electrical contacts are exposed over a length which corresponds to the number of integrated circuit chips that are to be stacked. At least one of the parallel electrical contacts is removable from a body element in order to eliminate electrical contact to at least one of the integrated circuit chip pins. Additionally, there is provided a means for urging the two body elements into an engagement so as to provide a secure electrical contact.

According then to the preferred embodiment of the invention, an integrated circuit chip, such as a memory device, mounted within a dual-in-line package, which is affixed to a circuit board, is paralleled with a number of similar chips by stacking the chips one atop the other and bending the pins of the chips such that each pin overlaps the corresponding pin of the chip immediately below it. The clip of the present invention is then affixed such that the clip engages all of the pins of the stacked chips. Those pins which are not to be paralleled are placed in a position which is substantially parallel to the surface of the circuit board and an opening, defined by one of the body member, permits the non-paralleled pins to project therethrough. The non-parallel pins can then be, connected to chip enabling circuitry either affixed to the circuit board or to external modules.

From the foregoing, it can be seen that it is a primary object of the present invention to provide a clip which facilitates expansion of memory capacity for a system;

It is another object of the present invention to provide a means for electrically paralleling two or more stacked integrated circuit chips;

It is a further object of the present invention to provide a novel means for paralleling a plurality of integrated circuit chips, which means permits the chips to be quickly separated from each other in order to facilitate rework;

These and other objects of the present invention will become more apparent when taken in conjunction with the following description and drawings, wherein like characters indicate like parts and which drawings form a part of the present application.

BRIEF DESCRIPTION OF THE DRAWINGS

FIG. 3 is a sectioned view taken along the section lines 3—3 in FIG. 2; and

FIG. 4 is a perspective view illustrating the overall positioning of the inventive clip of the present application when affixing a number of integrated circuit chips in a stacked fashion to a circuit board.

DESCRIPTION OF THE PREFERRED EMBODIMENT

Figure 1:
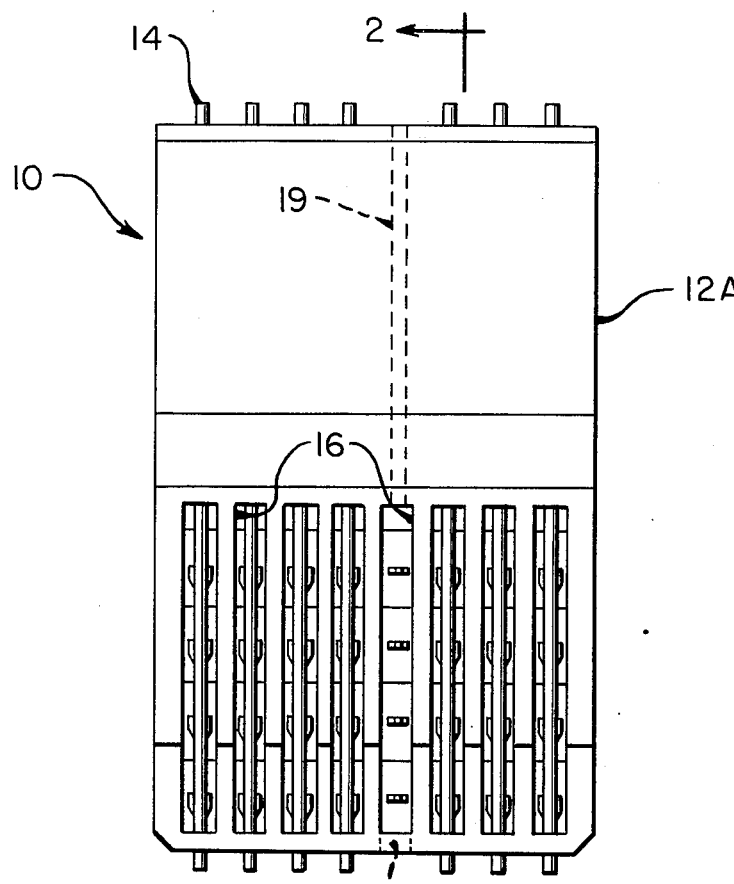
FIG. 1 is a front view of a preferred embodiment of the invention.
Figure 2:
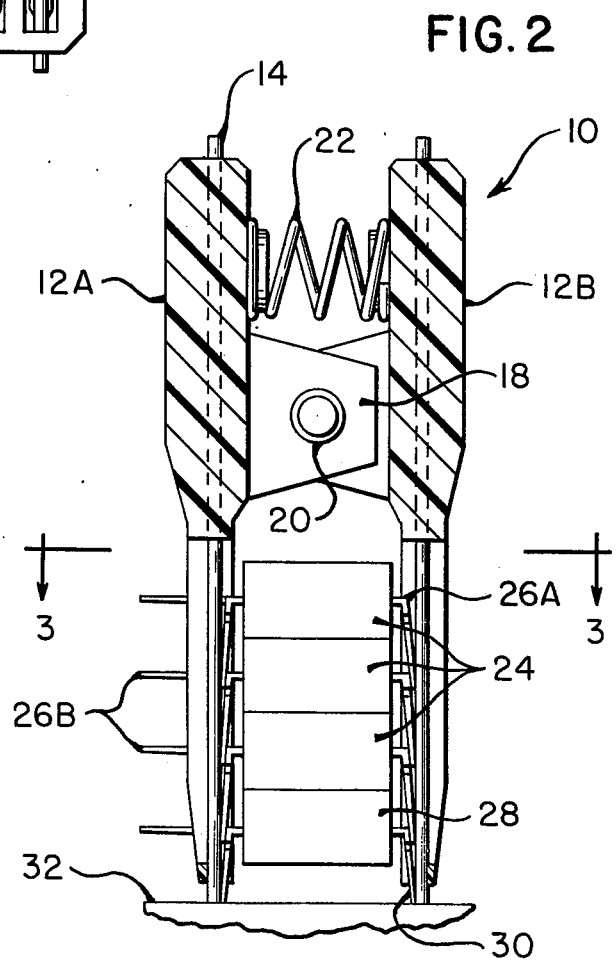
FIG. 2 is an end view of the clip of the present invention taken along the section lines 2—2 in FIG. 1 shown affixing a plurality of integrated circuit chips to a circuit board.

Referring to FIGS. 1 and 2, the clip 10 is shown comprised of a first and second body member 12A and 12B, respectively. The body member may be formed from an insulating material such as plastic. The body member for the preferred embodiment is shown to be rectangular in shape, although this shape is in no way limiting. Affixed to the inner surfaces of the first and second body members are pivot mounts 18, which pivot mounts are joined by means of a pivotting pin 20. The pivot mounts 18 are of a length which permits the electrical contacts 14 in one body member to be substantially parallel to the electrical contacts in the other body member when the clip is in its operating position. A plurality of parallel openings 16 extend through each of the body members for a length which corresponds substantially to the total thickness of the integrated circuit chips that are to be stacked. A plurality of drilled holes 19 extend thru each of the body members along an axis extending thru the center of each of the plurality of parallel openings 16. Electrical contact pins 14 are pressed thru the openings 19 at all positions where the integrated circuit pins are to be connected in parallel. A spring 22 is affixed between the body members 12A and 12B to urge the clip into closure at the end having the openings 16.

An integrated circuit chip 28 of the dual-in-line packaged type is shown affixed to a circuit board 32 by means of its pins 30. A plurality of similar chips 24 are stacked on the board mounted chip 28. The integrated circuit chips utilized with the preferred embodiment of the present invention were identical memory chips stacked one atop the other with their pins 26A overlapping and in electrical contact with like pins 30. Those pins which enable individual selection of the chips, such as pins 26B, are positioned horizontally with respect to the circuit board 32 and project through the defined opening 16 in the clip body at the location wherein the electrical contact 14 is removed. Although only one electrical contact pin is shown removed from the clip assembly, it is to be understood that any number of contact pins may be removed in order to permit the non-paralleling of selected pins of the stacked chips.

Referring now to FIG. 3, wherein the sectioned view of one of the clip body members is shown. The pins 26A of the integrated circuit chip 24 are shown fitting partially into the defined opening 16 of the clip body member 12A, while being limited and/or pressed against the electrical contact pins 14. The one pin labelled 26B is shown extending completely through the defined opening 16 so as to permit easy access to the pin for connection to other enabling electronics and also to maintain the pin in a non-parallel electrical connection.

Referring now to FIG. 4 wherein the clip 10 of the present invention is shown stacking three memory integrated circuit chips 24 onto a board mounted integrated circuit chip 28. The integrated circuit chip 28 is connected in circuit onto the board 32. Additional utilization means, not shown, can be connected to the pins 26B for selecting one or more of the stacked integrated circuit chips.

Although the invention has been described and illustrated in detail, it is to be clearly understood that the same is by way of illustration and example only, and is not to be taken by way of limitation, the spirit and scope of the invention being limited only by the terms of the appended claims.

What is claimed is:

1. A clip for electrically paralleling a stacked plurality of integrated circuit chips each having a number of electrical pins, comprising:
    a body member adapted to receive said plurality of integrated circuit chips;
    a plurality of electrical contacts associated with said body member for connecting a desired number of said electrical pins in parallel; and
    access openings thru said body member for enabling access to those of said electrical pins which are not connected in parallel by said electrical contacts.

2. A clip according to claim 1 and further comprising: means for urging said electrical contacts against the electrical pins of said stacked plurality of integrated circuit chips.

3. A clip for electrically connecting one or more integrated circuit chips in parallel with a board mounted integrated circuit chip comprising:
    two body elements;
    a plurality of parallel electrical contacts affixed to each of said body elements and spaced to correspond to the position of associated integrated circuit chip pins, said electrical contacts being exposed over a length corresponding to the number of integrated circuit chips that are to be paralleled;
    at least one of said parallel electrical contacts being removable from said body element in order to eliminate electrical contact to at least one of the integrated circuit pins;
    at least one of said body elements has a defined opening along the path of said at least one parallel electrical contact for permitting the pins of the integrated circuit chips, located along said defined opening to project thru said body member; and
    means for urging said two body elements into engagement.

4. A clip according to claim 3 wherein each of said body members is substantially rectangular in shape and has a width that is slightly greater than the length of the integrated circuit chips.

5. A clip according to claim 3 and further comprising:
    means for pivotally connecting said two body elements at a spaced apart distance which enables positioning each of said parallel electrical contacts into simultaneous engagement with all of the pins of the stacked integrated circuit chips.

6. A clip for electrically paralleling a stacked plurality of integrated circuit chips each having a number of electrical pins, comprising:
    a body member adapted to receive said plurality of integrated circuit chips;
    a plurality of electrical contacts associated with said body member for connecting a desired number of said electrical pins in parallel; and
    access means associated with said body member for enabling access to those of said electrical pins which are not to be connected in parallel, wherein said access means is a defined opening along the path of said at least one electrical contact for permitting the electrical pins of said stacked plurality of integrated circuit pins positioned along said defined opening to project thru said body member.

7. A clip according to claim 6 wherein each of said body members is substantially rectangular in shape and has a width that is slightly greater than the length of the integrated circuit chips.

8. A clip according to claim 6 and further comprising:
    means for pivotally connecting said two body elements at a spaced apart distance which enables positioning each of said parallel electrical contacts into simultaneous engagement with all of the pins of the stacked integrated circuit chips.

9. A clip for electrically connecting one or more integrated circuit chips in parallel with a board mounted integrated circuit chip comprising:
    two body elements;
    a plurality of parallel electrical contacts affixed to each of said body elements and spaced to correspond to the position of associated integrated circuit chip pins, said electrical contacts being exposed over a length corresponding to the number of integrated circuit chips that are to be paralleled;
    at least one of said parallel electrical contacts being removable from said body element in order to eliminate electrical contact to at least one of the integrated circuit pins;
    means for pivotally connecting said two body elements at a spaced apart distance which enables positioning each of said parallel electrical contacts into simultaneous engagement with all of the associated pins of the stacked integrated circuit chips; and
    means for urging said two body elements into engagement.

10. A clip for electrically connecting one or more integrated circuit chips in parallel with a board mounted integrated circuit chip comprising:

two body elements each having a plurality of parallel openings spaced apart a distance corresponding to the pin spacing of said integrated circuit chips;
a plurality of parallel electrical contacts positioned in said plurality of parallel openings and being exposed over a length corresponding to the number of integrated circuit chips that are to be paralleled;
at least one of said parallel electrical contacts being removable from said body elements in order to eliminate electrical contact to at least one of the integrated circuit pins; and
means for urging said two body elements into engagement.

* * * * *

UNITED STATES PATENT AND TRADEMARK OFFICE
CERTIFICATE OF CORRECTION

PATENT NO. : 4,116,518

DATED : September 26, 1978

INVENTOR(S) : Larry J. Pleskac

It is certified that error appears in the above–identified patent and that said Letters Patent are hereby corrected as shown below:

Page 1,

Lefthand column, after "Filed: Aug. 31, 1977", delete "(Under 37 CFR 1.47)".

Signed and Sealed this

Twenty-seventh Day of February 1979

[SEAL]

Attest:

RUTH C. MASON
*Attesting Officer*

DONALD W. BANNER
*Commissioner of Patents and Trademarks*